(12) United States Patent
Kishimoto

(10) Patent No.: US 11,005,054 B2
(45) Date of Patent: May 11, 2021

(54) DISPLAY DEVICE COMPRISING HEAT SINK COMPRISING METAL ALLOY

(71) Applicant: Samsung Display Co., Ltd., Yongin-si (KR)

(72) Inventor: Hirotsugu Kishimoto, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/256,940

(22) Filed: Jan. 24, 2019

(65) Prior Publication Data

US 2019/0259966 A1  Aug. 22, 2019

(30) Foreign Application Priority Data

Feb. 21, 2018 (KR) .................. 10-2018-0020338

(51) Int. Cl.
| | | |
|---|---|---|
| H01L 51/00 | (2006.01) | |
| H01L 51/52 | (2006.01) | |
| G06F 3/041 | (2006.01) | |
| H01L 27/32 | (2006.01) | |

(52) U.S. Cl.
CPC ........ *H01L 51/0097* (2013.01); *G06F 3/0412* (2013.01); *H01L 51/529* (2013.01); *H01L 51/5284* (2013.01); *H01L 27/323* (2013.01)

(58) Field of Classification Search
CPC .............................. G06F 3/0412; H01L 27/323
See application file for complete search history.

(56) References Cited

U.S. PATENT DOCUMENTS

| | | | | |
|---|---|---|---|---|
| 2007/0267734 A1* | 11/2007 | Zhao | ................ | H01L 23/49503 257/687 |
| 2013/0056783 A1* | 3/2013 | Aurongzeb | ........... | H01L 51/529 257/99 |
| 2014/0085830 A1* | 3/2014 | Fukuda | ................ | H05K 1/0271 361/720 |
| 2015/0055302 A1* | 2/2015 | Nagatomo | ........... | H05K 1/0207 361/709 |
| 2015/0376755 A1* | 12/2015 | Kim | ......................... | C22C 9/00 148/554 |
| 2017/0179688 A1* | 6/2017 | Krebs | ..................... | H01T 13/36 |
| 2018/0252483 A1* | 9/2018 | Geng | .................. | H01L 23/3672 |
| 2018/0375056 A1* | 12/2018 | Sonoda | .............. | H01L 27/3244 |
| 2019/0044093 A1* | 2/2019 | Sargent | ................ | G06F 1/1601 |
| 2019/0073505 A1* | 3/2019 | Kwon | .................. | G06K 9/0004 |

FOREIGN PATENT DOCUMENTS

| | | |
|---|---|---|
| KR | 10-2015-0078184 A | 7/2015 |
| KR | 10-2015-0134142 A | 12/2015 |
| KR | 10-1596965 B1 | 2/2016 |
| KR | 10-2016-0030599 A | 3/2016 |
| KR | 10-2016-0076005 A | 6/2016 |
| KR | 10-2016-0110675 A | 9/2016 |

* cited by examiner

*Primary Examiner* — Ryan A Lubit
(74) *Attorney, Agent, or Firm* — Lewis Roca Rothgerber Christie LLP

(57) ABSTRACT

A display device according to an exemplary embodiment includes: a display panel for displaying an image; a support plate provided on one side of the display panel; and a heat sink layer provided below the support plate, wherein the heat sink layer includes a metal alloy having thermal conductivity that is equal to or greater than 150 W/mK and equal to or less than 340 W/mK, and an elastic modulus that is equal to or greater than 100 GPa and equal to or less than 140 GPa.

14 Claims, 2 Drawing Sheets

DISPLAY DEVICE COMPRISING HEAT SINK COMPRISING METAL ALLOY

CROSS-REFERENCE TO RELATED APPLICATION

This application claims priority to and the benefit of Korean Patent Application No. 10-2018-0020338 filed in the Korean Intellectual Property Office on Feb. 21, 2018, the entire contents of which are incorporated herein by reference.

BACKGROUND

1. Field

The present disclosure relates to a display device.

2. Description of the Related Art

In general, a liquid crystal display (LCD) and an organic light emitting diode (OLED) display are used as a display device.

Flexible display devices that are capable of displaying images when a flexible substrate is partly bent by forming a display unit and wires on the flexible substrate made of a flexible material such as plastic are attracting attention as next-generation display devices.

An SUS plate (e.g., stainless steel plate) is disposed on a lower portion of the flexible display device so as to improve impact resistance. However, the SUS plate has low thermal conductivity, so heat radiation of the flexible display device to which the SUS plate is attached may be deteriorated. Therefore, display defects such as mura or stain may be generated in the flexible display device.

To prevent or reduce deterioration of the radiation of heat, a heat sink layer including graphite may be disposed on a lower side of the SUS plate. However, in this case, it becomes difficult to have a flexible characteristic.

The above information disclosed in this Background section is only for enhancement of understanding of the background of the present disclosure and therefore it may contain information that does not form the prior art that is already known in this country to a person of ordinary skill in the art.

SUMMARY

The present disclosure has been made in an effort to provide a flexible display device with improved flexibility and heat radiation.

An exemplary embodiment of the present disclosure provides a display device including: a display panel for displaying an image; a support plate provided on one side of the display panel; and a heat sink layer provided below the support plate, wherein the heat sink layer includes a metal alloy having thermal conductivity that is equal to or greater than 150 W/mK and equal to or less than 340 W/mK, and an elastic modulus that is equal to or greater than 100 GPa and equal to or less than 140 GPa.

The heat sink layer may include a copper alloy.

The heat sink layer may further include iron (Fe) at 0.01 to 0.3 wt % and phosphorus (P) at an amount of 0.005 to 0.15 wt % based on, for example, the total weight of the metal alloy.

The heat sink layer may further include zinc (Zn) at an amount of 0.02 to 2.0 wt % based on, for example, the total weight of the metal alloy.

The heat sink layer may further include nickel (Ni) at an amount of 0.2 to 3.5 wt % based on, for example, the total weight of the metal alloy.

The heat sink layer may include at least one of nickel (Ni) and cobalt (Co) at an amount of 1.0 to 4.0 wt % based on, for example, the total weight of the metal alloy.

The heat sink layer may further include silicon (Si) at an amount of 0.2 to 1.2 wt % based on, for example, the total weight of the metal alloy.

A light blocking layer may be provided between the support plate and the heat sink layer.

The support plate may include one of polyethylene terephthalate (PET), polybutylene terephthalate (PBT), polysilane, polysiloxane, polysilazane, polycarbosilane, polyacrylate, polymethacrylate, polymethylacrylate, polymethylmethacrylate, polyethylacrylate, polyethylmethacrylate, a cyclic olefin copolymer (COC), a cyclic olefin polymer (COP), polyethylene (PE), polypropylene (PP), polyimide (PI), polymethyl methacrylate (PMMA), polystyrene (PS), polyacetal (POM), polyether ether ketone (PEEK), polyether sulfone (PES), polytetrafluoroethylene (PTFE), polyvinyl chloride (PVC), polycarbonate (PC), polyvinylidene fluoride (PVDF), a perfluoroalkyl polymer (PFA), a styrene acrylonitrile copolymer (SAN), and/or a combination thereof.

At least one of a touch panel, a polarizer, and a window may be provided on the display panel.

According to an exemplary embodiment, the display device includes a heat sink layer having a modulus that is greater than a set or predetermined value and a metal alloy having thermal conductivity, thereby improving flexibility and concurrently (e.g., simultaneously) improving heat radiation.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
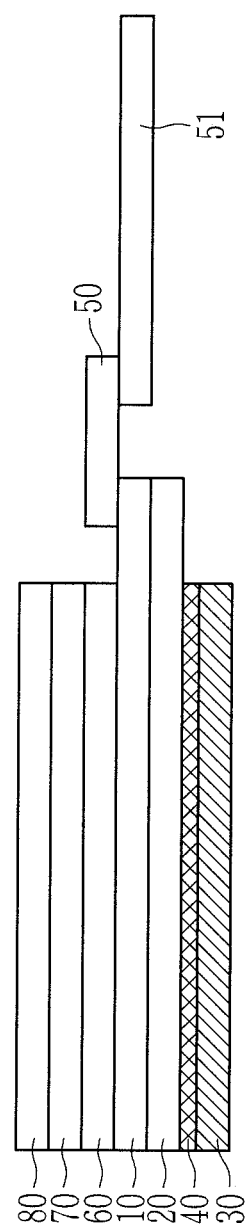
FIG. 1 shows a cross-sectional view of a display device according to an exemplary embodiment.

The subject matter of the present disclosure will be described more fully hereinafter with reference to the accompanying drawings, in which exemplary embodiments of the present disclosure are shown. As those skilled in the art would realize, the described embodiments may be modified in various different ways, all without departing from the spirit or scope of the present disclosure.

The drawings and description are to be regarded as illustrative in nature and not restrictive, and like reference numerals designate like elements throughout the present disclosure.

The size and thickness of each configuration shown in the drawings may be arbitrarily shown for better understanding and ease of description, and the present disclosure is not limited thereto.

In the drawings, the thickness of layers, films, panels, regions, etc., may be exaggerated for clarity. For better understanding and ease of description, the thicknesses of some layers and areas may be exaggerated. It will be understood that when an element such as a layer, film, region, or substrate is referred to as being "on" another element, it can be directly on the other element or intervening elements may also be present.

Unless explicitly described to the contrary, the word "comprise" and variations such as "comprises" or "comprising" will be understood to imply the inclusion of stated elements but not the exclusion of any other elements. The word "on" or "above" means positioned on or below the object portion, and does not necessarily mean positioned on the upper side of the object portion based on a gravitational direction.

FIG. 1 shows a cross-sectional view of a display device according to an exemplary embodiment.

As shown in FIG. 1, the display device includes a display panel 10 for displaying an image, a support plate 20 provided on one side of the display panel 10, and a heat sink layer 30 provided below the support plate 20.

The display panel 10 may be a flat display panel such as an organic light emitting panel or a liquid crystal panel.

A more detailed configuration of a display device according to an exemplary embodiment will now be described with reference to FIG. 2.

Figure 2:
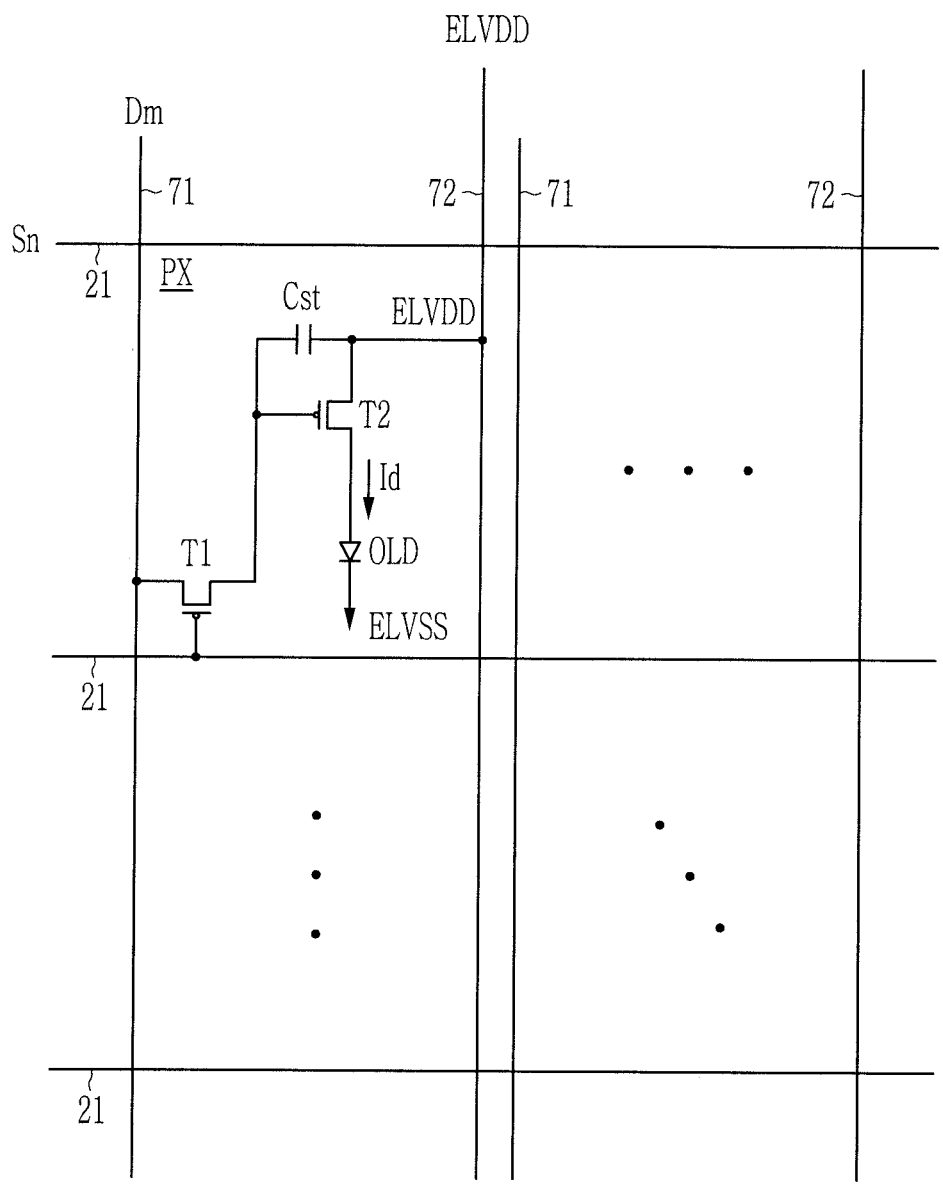
FIG. 2 shows an equivalent circuit diagram of a display device according to an exemplary embodiment.

FIG. 2 shows an equivalent circuit diagram of a display device according to an exemplary embodiment.

As shown in FIG. 2, the display device may include an organic light emitting panel. In this case, the organic light emitting panel includes a plurality of signal lines 21, 71, and 72, and a plurality of pixels (PXs) coupled to (e.g., connected to) a plurality of signal lines and arranged in a matrix form. The signal lines 21, 71, and 72 include a plurality of scan lines 21 for transmitting a scan signal (Sn), a plurality of data lines 71 crossing the scan lines 21 and transmitting a data signal (Dm), and a plurality of driving voltage lines 72 for transmitting a driving voltage (ELVDD). The scans line 21 extend substantially in a row direction and are substantially in parallel with each other, and the data lines 71 and the driving voltage lines 72 extend substantially in a column direction and are substantially in parallel with each other.

The pixels (PXs) include a plurality of transistors T1 and T2 respectively coupled to (e.g., connected to) the plurality of signal lines 21, 71, and 72, a storage capacitor (Cst), and an organic light emitting diode (OLD).

The transistors T1 and T2 include a switching transistor T1 coupled to (e.g., connected to) the data lines 71, and a driving transistor T2 coupled to (e.g., connected to) the organic light emitting diode (OLD).

The switching transistor T1 includes a control terminal, an input terminal, and an output terminal, and the control terminal is coupled to (e.g., connected to) the scan line 21, the input terminal is coupled to (e.g., connected to) the data line 71, and the output terminal is coupled to (e.g., connected to) the driving transistor T2. The switching transistor T1 transmits the data signal (Dm) applied to the data line 71 to the driving transistor T2 in response to the scan signal (Sn) applied to the scan line 21.

The driving transistor T2 includes a control terminal, an input terminal, and an output terminal, and the control terminal is coupled to (e.g., connected to) the switching transistor T1, the input terminal is coupled to (e.g., connected to) the driving voltage line 72, and the output terminal is coupled to (e.g., connected to) the organic light emitting diode (OLD). The driving transistor T2 outputs a driving current (Id) of which the size is variable by the voltage between the control terminal and the output terminal.

The storage capacitor Cst is coupled between (e.g., connected between) the control terminal and the input terminal of the driving transistor T2. The storage capacitor Cst charges the data signal applied to the control terminal of the driving transistor T2, and maintains this after the switching transistor T1 is turned off.

The organic light emitting diode (OLD) includes an anode coupled to (e.g., connected to) the output terminal of the driving transistor T2, and a cathode coupled to (e.g., connected to) the common voltage (ELVSS). The organic light emitting diode (OLD) displays the image by emitting light with different intensities according to the driving current (Id) of the driving transistor T2.

The switching transistor T1 and the driving transistor T2 may be n-channel field effect transistors (FETs) or p-channel field effect transistors. Connections of the transistors T1 and T2, the storage capacitor Cst, and the organic light emitting diode (OLD) are changeable.

The support plate 20 may include a flexible material so that the support plate 20 may be bent. For example, the support plate 20 may be a film type (or kind) including one of a polyester-based polymer, a silicon-based polymer, an acryl-based polymer, a polyolefin-based polymer, and/or a copolymer thereof. In more detail, the support plate 20 may include one of polyethylene terephthalate (PET), polybutylene terephthalate (PBT), polysilane, polysiloxane, polysilazane, polycarbosilane, polyacrylate, polymethacrylate, polymethylacrylate, polymethylmethacrylate, polyethylacrylate, polyethylmethacrylate, a cyclic olefin copolymer (COC), a cyclic olefin polymer (COP), polyethylene (PE), polypropylene (PP), polyimide (PI), polymethyl methacrylate (PMMA), polystyrene (PS), polyacetal (POM), polyether ether ketone (PEEK), polyether sulfone (PES), polytetrafluoroethylene (PTFE), polyvinyl chloride (PVC), polycarbonate (PC), polyvinylidene fluoride (PVDF), a perfluoroalkyl polymer (PFA), a styrene acrylonitrile copolymer (SAN), and/or a combination thereof.

The heat sink layer 30 may include a metal alloy such as a copper alloy.

The heat sink layer 30 may have thermal conductivity that is equal to or greater than 150 W/mK and equal to or less than 340 W/mK, and an elastic modulus that is equal to or greater than 100 GPa and equal to or less than 140 GPa.

When the thermal conductivity of the heat sink layer 30 is less than 150 W/mK, radiation of heat may be deteriorated. When the elastic modulus of the heat sink layer 30 is less than 100 GPa, flexibility is deteriorated, and when it is greater than 140 GPa, rigidity may be deteriorated.

In some embodiments, the heat sink layer 30 may further include iron (Fe) at 0.01 to 0.3 wt % and phosphorus (P) at 0.005 to 0.15 wt %, based on, for example, the total weight of the metal alloy. The heat sink layer 30 may further include zinc (Zn) at 0.02 to 2.0 wt %, based on, for example, the total weight of the metal alloy. The heat sink layer 30 may further include nickel (Ni) at 0.2 to 3.5 wt %, based on, for example, the total weight of the metal alloy.

Table 1 is a table for estimating generation frequency of mura and impact resistance of a display device according to exemplary embodiments and comparative examples. Regarding suitability of generation of mura in Table 1, a case in which no mura is generated to the display device after it is irradiated for 100 hours at 2000 nit and a case in which a mura is generated to the display device after it is irradiated for 50 hours at 2000 nit are estimated to be suitable (indicated with "O"). A case in which a mura is generated to the display device after it is irradiated for 10 hours at 1000 nit and a case in which a mura is generated to the display device after it is irradiated for 10 hours at 300 nit are estimated to not be suitable (indicated with "X"). Further, regarding suitability of impact resistance, a case in which no defect is generated to the display device when a ball of 50 g is dropped from a height of 20 cm and a case in which a defect is generated to the display device when a ball of 50 g is dropped from the height of 20 cm are estimated to be suitable (indicated with "O"), and cases in which a defect is generated when a ball of 50 g is dropped to the display device from heights of 15 cm, 10 cm, and 5 cm are estimated to not be suitable (indicated with "X").

TABLE 1

| | Elastic coefficient (MPa) | Thermal conductivity (W/mK) | Mura generation suitability | Impact resistance suitability | Fe wt % | P wt % | Zn wt % | Ni wt % | Co wt % | Si wt % |
|---|---|---|---|---|---|---|---|---|---|---|
| Exemplary embodiment 1 | 108 | 335 | O | O | 0.1 | 0.01 | 0.1 | 0.7 | — | — |
| Exemplary embodiment 2 | 103 | 324 | O | O | 0.3 | 0.1 | — | — | — | — |
| Exemplary embodiment 3 | 118 | 265 | O | O | 0.1 | 0.13 | — | 0.7 | — | — |
| Exemplary embodiment 4 | 132 | 211 | O | O | — | — | — | 2.4 | — | 0.6 |
| Exemplary embodiment 5 | 135 | 207 | O | O | — | — | — | 1.8 | — | 0.4 |
| Exemplary embodiment 6 | 123 | 182 | O | O | — | — | — | 1.5 | 1.1 | 0.6 |
| Exemplary embodiment 7 | 127 | 170 | O | O | — | — | — | 3.2 | — | 0.7 |
| Comparative Example 1 | 141 | 143 | X | O | 0.5 | 0.1 | 0.1 | 0.7 | — | — |
| Comparative Example 2 | 93 | 368 | O | X | 0.1 | 0.04 | — | 0.03 | — | — |
| Comparative Example 3 | 200 | 16 | X | O | SUS | | | | | |

As shown in Exemplary Embodiments 1 to 3 and Comparative Examples 1 and 2 in Table 1, the generation of mura and impact resistance are suitable when the heat sink layer 30 further includes iron (Fe) at 0.01 to 0.3 wt % (based on, for example, the total weight of the metal alloy) and phosphorus (P) at 0.005 to 0.15 wt % (based on, for example, the total weight of the metal alloy) in copper (Cu), when it further includes zinc (Zn) at 0.02 to 2.0 wt % (based on, for example, the total weight of the metal alloy), and when it further includes nickel (Ni) at equal to or less than 0.9 wt % (based on, for example, the total weight of the metal alloy).

The heat sink layer 30 may include at least one of nickel (Ni) or cobalt (Co) at 1.0 to 4.0 wt % (based on, for example, the total weight of the metal alloy) in copper. The heat sink layer 30 may further include silicon (Si) at 0.2 to 1.2 wt % (based on, for example, the total weight of the metal alloy).

As shown in Exemplary Embodiments 4 to 7 of Table 1, the generation of mura and impact resistance are suitable when the heat sink layer 30 includes at least one of nickel (Ni) or cobalt (Co) at 1.0 to 4.0 wt % (based on, for example, the total weight of the metal alloy) in copper (Cu) and when it further includes silicon (Si) at 0.2 to 1.2 wt % (based on, for example, the total weight of the metal alloy).

A light blocking layer 40 may be provided between the support plate 20 and the heat sink layer 30. The light blocking layer 40 is formed to be black, thereby preventing light from leaking to the outside (or thereby reducing the leakage of light to the outside).

A chip on film (COF) 50 mounted on a driving circuit chip for generating a driving signal for driving the display panel 10 is provided on one end of the display panel 10. A printed circuit board (PCB) 51 for generating an external signal and transmitting the same to the driving circuit chip or the display panel 10 may be attached to the chip on film 50.

A touch panel 60, a polarizer 70, and a window 80 are sequentially provided on the display panel 10.

The touch panel 60 is used as an input device of the display device, and a user contacts a screen with a finger or a pen to input information. The touch panel 60 may be attached to the display panel 10, or it may be formed inside the display panel 10.

The polarizer 70 represents a layer for improving display quality by preventing or reducing the reflection of external light, and it may include a plurality of thin-film layers. The thin-film layers may include at least one metal thin-film layer and at least one dielectric layer alternately stacked.

According to the present exemplary embodiment, the polarizer 70 is provided outside the display panel 10, and without being limited to this, it may be provided inside the display panel 10.

The window 80 covers the display panel to protect the same from external impacts.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

While the subject matter of the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims, and equivalents thereof.

What is claimed is:

1. A display device comprising:
a display panel for displaying an image;
a support plate provided on one side of the display panel; and
a heat sink layer provided below the support plate,
wherein the heat sink layer comprises a copper alloy having thermal conductivity that is equal to or greater than 265 W/mK and equal to or less than 335 W/mK, and having an elastic modulus that is equal to or greater than 108 GPa and equal to or less than 118 GPa.

2. The display device of claim 1, wherein:
the copper alloy comprises iron (Fe) at 0.01 to 0.3 wt % and phosphorus (P) at 0.005 to 0.15 wt %.

3. The display device of claim 2, wherein:
the copper alloy further comprises zinc (Zn) at 0.02 to 2.0 wt %.

4. The display device of claim 3, wherein:
the copper alloy further comprises nickel (Ni) at 0.2 to 0.9 wt %.

5. The display device of claim 3, wherein:
the heat sink layer further comprises nickel (Ni) at 0.2 to 3.5 wt %.

6. The display device of claim 1, wherein:
the support plate comprises one selected from polyethylene terephthalate (PET), polybutylene terephthalate (PBT), polysilane, polysiloxane, polysilazane, polycarbosilane, polyacrylate, polymethacrylate, polymethylacrylate, polymethylmethacrylate, polyethylacrylate, polyethylmethacrylate, a cyclic olefin copolymer (COC), a cyclic olefin polymer (COP), polyethylene (PE), polypropylene (PP), polyimide (PI), polymethyl methacrylate (PMMA), polystyrene (PS), polyacetal (POM), polyether ether ketone (PEEK), polyether sulfone (PES), polytetrafluoroethylene (PTFE), polyvinyl chloride (PVC), polycarbonate (PC), polyvinylidene fluoride (PVDF), a perfluoroalkyl polymer (PFA), a styrene acrylonitrile copolymer (SAN), and a combination thereof.

7. The display device of claim 1, wherein:
at least one selected from a touch panel, a polarizer, and a window is provided on the display panel.

8. The display device of claim 1, further comprising a light blocking layer between the support plate and the heat sink layer,
wherein the light blocking layer covers all of an upper surface of the heat sink layer.

9. A display device comprising:
a display panel for displaying an image;
a support plate provided on one side of the display panel; and
a heat sink layer provided below the support plate,
wherein the heat sink layer comprises a copper alloy having thermal conductivity that is equal to or greater than 170 W/mK and equal to or less than 211 W/mK, and having an elastic modulus that is equal to or greater than 132 GPa and less than 135 GPa.

10. The display device of claim 9, wherein:
the copper alloy comprises nickel (Ni) at 1.0 to 4.0 wt %.

11. The display device of claim 10, wherein:
the copper alloy further comprises silicon (Si) at 0.2 to 1.2 wt %.

12. The display device of claim 9, further comprising a light blocking layer between the support plate and the heat sink layer,
wherein the light blocking layer covers all of an upper surface of the heat sink layer.

13. The display device of claim 9, wherein:
the support plate comprises one selected from polyethylene terephthalate (PET), polybutylene terephthalate (PBT), polysilane, polysiloxane, polysilazane, polycarbosilane, polyacrylate, polymethacrylate, polymethylacrylate, polymethylmethacrylate, polyethylacrylate, polyethylmethacrylate, a cyclic olefin copolymer (COC), a cyclic olefin polymer (COP), polyethylene (PE), polypropylene (PP), polyimide (PI), polymethyl methacrylate (PMMA), polystyrene (PS), polyacetal (POM), polyether ether ketone (PEEK), polyether sulfone (PES), polytetrafluoroethylene (PTFE), polyvinyl chloride (PVC), polycarbonate (PC), polyvinylidene fluoride (PVDF), a perfluoroalkyl polymer (PFA), a styrene acrylonitrile copolymer (SAN), and a combination thereof.

14. The display device of claim 9, wherein:
at least one selected from a touch panel, a polarizer, and a window is provided on the display panel.

* * * * *